United States Patent [19]

Trommer

[11] Patent Number: 4,505,765
[45] Date of Patent: Mar. 19, 1985

[54] MANUFACTURING METHOD FOR A PLANAR PHOTODIODE WITH HETERO-STRUCTURE

[75] Inventor: Reiner Trommer, Munich, Fed. Rep. of Germany

[73] Assignee: Siemens Aktiengesellschaft, Berlin & Munich, Fed. Rep. of Germany

[21] Appl. No.: 505,349

[22] Filed: Jun. 17, 1983

[30] Foreign Application Priority Data

Jul. 21, 1982 [DE] Fed. Rep. of Germany ....... 3227263

[51] Int. Cl.³ .............................................. H01L 31/06
[52] U.S. Cl. ....................................... 148/171; 357/17; 357/30; 29/572; 29/576 E; 148/187
[58] Field of Search .............. 29/572, 576 E; 148/171, 148/187, 175; 357/17, 30

[56] References Cited

U.S. PATENT DOCUMENTS 3,780,358 12/1973 Thompson ........................... 148/171
4,383,266 5/1983 Sakai et al. ........................... 357/13
4,411,732 10/1983 Witherspoon ....................... 156/643

OTHER PUBLICATIONS

"Electronic Letters", vol. 16, (1980), pp. 163-165.
"IEEE Journal of Quantum Electronics", vol. 17, (1981), pp. 260-264.
"Applied Physics Letters", vol. 39, (1981), pp. 402-404.

Primary Examiner—L. Dewayne Rutledge
Assistant Examiner—Christopher W. Brody
Attorney, Agent, or Firm—Hill, Van Santen, Steadman & Simpson

[57] ABSTRACT

In a method for manufacturing an avalanche photodiode with an epitaxial layer sequence on a carrier body, the carrier body is not the substrate for an epitaxy of the photodiode. One of the epitaxial layers is employed as a selectively etchable mask for generating a pn junction of the diode.

6 Claims, 3 Drawing Figures

MANUFACTURING METHOD FOR A PLANAR PHOTODIODE WITH HETERO-STRUCTURE

BACKGROUND OF THE INVENTION

The present invention relates to a manufacturing method for a planar photodiode with a hetero-structure formed between a layer provided with a pn junction and a layer adjacent thereto.

Photodiodes with the avalanche effect which are suitable for the wave length range up to 1.65 μm and for employment in optical message transmission systems with light wave guides are known. For example, mesa diodes for this purpose are known from "Electronic Letters", Vol. 16 (1980), pages 163-165, from "IEEE Journal of Quantum Electronics", Vol. 17 (1981), pages 260-264, and "Applied Physics Letters", Vol. 39 (1981), pages 402-404, all incorporated herein by reference. Given this specific structure of the diode, indium gallium arsenide phosphide is deposited on indium phosphide in the course of a manufacturing process of the diode. Apart from the necessity of the mesa structure, the product of layer thickness and doping given this known diode is very difficult to set with the tolerance required per se.

Planar photodiodes with indium phosphide deposited on indium gallium arsenide phosphide and with a long-wave sensitivity limit above 1.36 μm are manufactured with the assistance of gaseous phase epitaxy. The pn junction given these diodes is generated with the assistance of a p-doping diffusion, whereby a layer of dielectric material—such as, for example, silicon nitride—is employed as the diffusion mask. Details concerning this prior art can be derived from "IEEE Journal of Quantum Electronics", Vol. 17 (1981), page 250, incorporated herein by reference.

Constructing diodes manufactured in known manner with gaseous phase epitaxy as discussed above with the assistance of liquid phase epitaxy—while still achieving at least a comparably high quality of the diodes—results in the problem that indium phosphide can only be deposited with great difficulty on an indium gallium arsenide phosphide layer with a sufficiently high arsenic content that a sufficiently high wavelength is achieved. If possible this wavelength is greater than 1.3 μm.

SUMMARY OF THE INVENTION

An object of the present invention is to specify a photodiode with the avalanche effect for a wavelength range up to if possible 1.65 μm, and to specify its manufacturing method, the manufacture of said photodiode being technologically simpler without sacrificing quality and performance of the diode.

For a method according to the invention, a first layer and then a second layer are epitaxially deposited on a substrate body. The semiconductor material of the second layer is a material having a background doping value such that a pn junction with an avalanche effect is subsequently generatable in the second layer. A material of the first layer is selectively etchable relative to the material of the second layer. A material of the substrate body is selectively etchable relative to the material of the first layer. Finally, a diffusion coefficient of a dopant for the second layer is at least not significantly higher for the material of the first layer than for the material of the second layer. A third layer is now epitaxially grown on the second layer, the third layer comprising a material having as high as possible an absorption of radiation for which the photodiode is being designed. A further semiconductor material is now epitaxially deposited for a carrier body on the third layer. The substrate body is selectively etched away and by photolithography, a corresponding mask opening is selectively etched in the first layer for subsequent generation of the pn junction in the second layer. A dopant is introduced into the second layer through the mask opening. A residue of the first layer is removed by means of selective etching. Finally the respective electrode terminals are applied to where said dopant was introduced into the second layer and at the carrier body.

The present invention is based on the desire of being able to work with liquid phase epitaxy. The possibility results of producing semiconductor layers with a lower residual doping of, for example, below $10^{16} cm^{-3}$, and/or a longer charge carrier useful life without increased expense. In addition to the carrier body, for the mechanical mounting of the diode, a diode according to the invention has a semiconductor layer consisting of, for example, indium phosphide with a superimposed p-doped layer region and n-doped layer region (so that a pn junction exists in the indium phosphide). The diode also has a layer of, for example, indium gallium arsenide phosphide grown in the indium phosphide which is provided for the absorption of the light radiation to be detected. The long-wave absorption edge of the material can be shifted toward higher wavelength values by means of a correspondingly high arsenic content. The zone of high electrical field and thus the avalanche multiplication is situated in the n-indium phosphide. Also, in order to avoid a high dark current, the field strength occurring during operation in the layer of indium gallium arsenide phosphide must be low. The field strength prevailing there serves only to collect the charge carriers generated by means of radiation absorption. The product of doping and layer thickness of the n-indium phosphide layer region—as described in greater detail below—can be precisely set according to the invention with a low tolerance of, for example, less than ±20%.

The ternary material indium gallium arsenide can also be provided for absorption of radiation up to 1.6 μm wavelength, instead of indium gallium arsenide phosphide for the absorption layer. Other examples of material combinations of a diode according to the invention are gallium antimonide for the layers with a pn junction and indium arsenic antimonide for the absorption layer. Also cadmium telluride for the layers with a pn junction and mercury cadmium telluride for the absorption layer may be employed. In all cases of the diode according to the invention, the carrier body is grown on the one side of the absorption layer whose surface lying opposite thereto is grown on the layer in which the pn junction finally exists. This layer, which has the pn junction, is therefore adjacent to the outer surface of the overall diode body and the pn junction in said layer is generated by means of in-diffusion and/or implantation of corresponding doping material into the semiconductor material of said layer which has preferably already been epitaxially grown with a corresponding (opposite) background doping. This doping step is provided by employment of a mask which, given the manufacture of the diode according to the invention, was a semiconductor layer on which the semiconductor layer in which the pn junction was later generated had been grown in an earlier manufacturing step. Such a semiconductor material has been employed as the semiconductor material for this masking layer so that not only can the semiconductor material for the pn junction be easily epitaxially grown thereon, but also the selective etching can be easily carried out for this material. For example, the aforementioned indium phosphide can be easily grown on the indium gallium arsenide phosphide even given a high arsenic content, and the indium gallium arsenide phosphide can be selectively etched in comparison to indium phosphide with $H_2SO_4 + H_2O_2 + H_2O$, for example (3:1:1). Thus, a hole or a mask opening can be easily etched in this masking layer, so that the indium phosphide lying below is only very slightly attacked—but still detectable later. The manufacturing method applied in this way in the framework of the invention can thus even be detected at the finished diode wherein finally after conclusion of the doping for the pn junction, the remaining material of the epitaxially grown mask has also been removed.

DESCRIPTION OF THE PREFERRED EMBODIMENTS

The starting point for a diode according to the invention can be a given semiconductor material such as, for example, indium phosphide, as the layer in which the pn junction is to be realized. As is known, indium phosphide is favorable with respect to a high avalanche effect i.e. with a high amplification factor.

Figure 1:
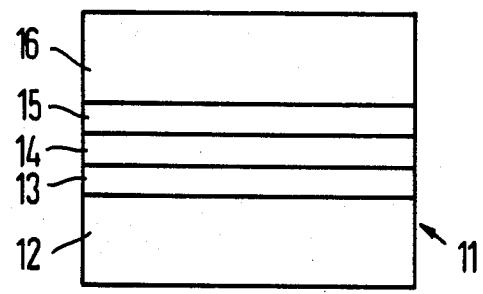
FIG. 1 illustrates a resulting structure after four initial epitaxial depositions.

In FIG. 1, a body constructed epitaxially overall of a substrate body, carrier body and three epitaxial layers is referenced 11. The substrate employed as a starting material is referenced 12. A first layer deposited on the substrate 12 is referenced 13, this serving in a later method step as a masking layer for generating the pn junction in the following layer 14 such as, for example, the indium phosphide prescribed here. Selection criteria for the material of layer 13 are that the prescribed material of the layer 14 must allow itself to be epitaxially deposited on the material of layer 13, and that the material of the layer 13 must allow itself to be deposited on the substrate 12. Since the layer 13 is to be employed as a masking layer, after the substrate body 12 has been removed by means of etching, the further selection criteria require that the material of layer 12 must be selectively etchable in comparison to that of the layer 13, and that the material of the layer 13 must also be selectively etchable relative to the material of the layer 14. Also, the material of the layer 13 must have a diffusion coefficient for the dopant to be introduced later into the layer 14 which is at least no significantly greater than the diffusion coefficient for said dopant in the material of the layer 14. For indium phosphide as the material of layer 14, indium gallium arsenide phosphide with a low arsenic content (in comparison to the material of the layer 15 yet to be described) is suitable as the material for the layer 13. Indium phosphide can again be employed for the substrate body 12. No special mention is required per se that the lattice constants coincide to the greatest possible degree in accordance with the pre-conditions for epitaxy. By means of selecting the indium gallium ratio in the indium gallium arsenide phosphide, a change of the lattice constant appearing per se due to the arsenic content can be reversed.

It has been indicated above that the material layer 14 in which the pn junction is can serve as the starting point. Viewed more strictly, the material of the layer 15 which is subsequently to be deposited epitaxially on the layer 14 must also be taken into consideration for the selection of such a starting point. The material of layer 15 serves in the finished diode to be active as an absorption layer for the radiation to be detected. A combination favorable for a photodiode with avalanche effect is, for example, indium phosphide for the layer 14 with the avalanche effect and indium gallium arsenide phosphide for the absorption layer 15. A higher arsenic content makes the overall diode useful for longer-wave infrared radiation.

In fact, epitaxial deposition of indium gallium arsenide phosphide having even a high arsenic content can be successfully carried out on indium phosphide. However, it is very problematical to deposit indium phosphide on precisely this indium gallium arsenide phosphide since an etching of the indium gallium arsenide phosphide thereby occurs so that the indium phosphide to be deposited and the layer thereby epitaxially arising experiences undesired contaminations.

Since the substrate body 12 must be removed given the method of the invention, a further semiconductor material, for example indium phosphide, is finally deposited epitaxially on the layer 15. That portion 16 of the body 11 later employed as the carrier body thereby results. The indium phosphide of the carrier body 16 is epitaxially deposited here from a tin melt from which indium phosphide can be epitaxially deposited on indium gallium arsenide phosphide, even given high arsenic content. An indium melt (for the specified materials to be deposited by way of example) must, on the other hand, be employed for the epitaxy of the layers 13 through 15.

Figure 2:
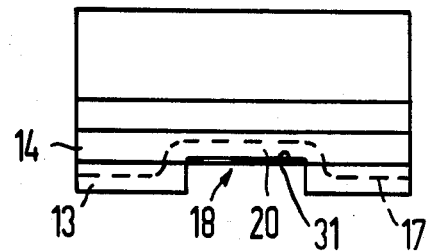
FIG. 2 illustrates the result of the masking and generation of the pn junction.

With the invention, after selectively etching off the original substrate body 12 and subsequent selective etching-in of the masking structure into the layer 13, a body consisting of the layers 14 and 15 and of the carrier body 16 arises wherein—apart from the masking layer 13—the layer 14 in which the pn junction is to be manufactured is the uppermost layer of that body, as shown in FIG. 2.

FIG. 2 shows the body which has arisen from the layer 13 (after the substrate body 12 has been etched away and the mask has been produced), this containing a pn junction after an already accomplished diffusion or implantation with a dopant. The boundary of this pn junction is indicated by the broken line 17. The mask opening in the layer 13 is referenced 18. As a result of diffusion coefficients in the layer 13 on the one hand and in the layer 14 on the other hand which are approximately identical but which in any case are not significantly greater, the doped region 20 given corresponding lateral limitation extends deep into the layer 14 up to a specific, precisely adjustable boundary. The depth of the layer 20 can be advanced up to an optimum proximity to the hetero junction boundary between the layers 14 and 15. Given, for example, a n background doping with $10^{16}$ through $10^{17}$ particles per $cm^3$ for the original material of the layer 14, a p-doping with, for example, $10^{19}$ is suitable for the layer or doped region 20.

Figure 3:
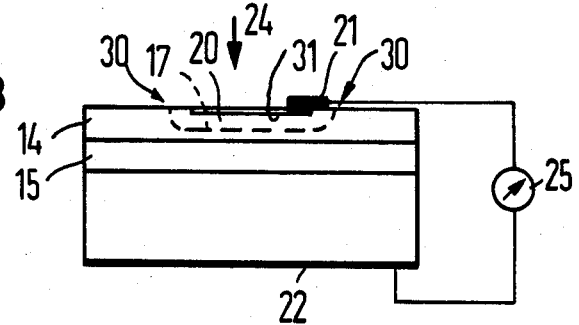
FIG. 3 illustrates a complete detector (photo) diode manufactured according to the invention.

FIG. 3 shows a finished, inventive diode (which is reversed in its illustration in comparison to FIG. 2). The masking layer 13 has already been removed given the diode according to FIG. 3. Electrical contacts for the electrical connection of the finished diode are referenced 21 and 22. The incident radiation, for example infrared radiation, to be detected is indicated with the arrow 24. This radiation 24 is absorbed by the layer 15 (in accordance with the selection of the material of said layer) to a relatively high degree upon generation of charge carriers. As a result of the electrical field between the contacts 21 and 22, these charge carriers are drawn into the region of the pn junction 17 and, amplified by the avalanche effect, result in a signal current 25 corresponding to the detection.

The method of manufacturing described above results in the layer 14 lying above the layer 15, although the layer 14 has been epitaxially deposited chronologically before the layer 15. Another particular advantage, however, is that a mask of epitaxially deposited material of the layer 13 has been employed.

It is standard per se to employ silicon dioxide or silicon nitride or the like as a masking material. This, however, leads to the fact that surface disruptions can occur in the semiconductor layer lying therebelow which can then lead to leakage currents in the area of the pn junction in which the pn junction strikes the outer surface of the body. These locations are pointed out with the reference numeral 30 and their arrow in FIG. 3.

Given employment of an epitaxially grown mask, no such disruptions producing leakage currents appear at such locations. The fact that the masking layer 13 was later removed by means of selective etching can be perceived at the finished diode by means of a slight etching attack on the layer 14 deriving from the selective etching of the layer 13, this being fundamentally indicated with the line referenced 31. The above figure description contains an example of a material selection for a manufacture of a diode according to the invention. Other exemplary material combinations are as follows:
1. Gallium antimonide for the layer 14 with high avalanche effect and indium arsenide antimonide for the layer 15 with a high radiation absorption. A layer 13 of indium gallium arsenide antimonide employable as a selectively etchable layer and as an epitaxy base for the layer 14 is provided and gallium antimonide is employed as substrate 12. Gallium antimonide can then be employed again for the carrier body 16.
2. Cadmium telluride for the layer 14 having a high avalanche effect and mercury cadmium telluride with a higher mercury content for the layer 15 having a high radiation absorption. A layer 13 consisting of mercury cadmium telluride with a small amount of mercury is provided as a selectively etchable layer and as an epitaxy base for the layer 14. Cadmium telluride is employed as the substrate 12. Cadmium telluride can then be again employed for the carrier body 16.

Although various minor changes and modifications might be proposed by those skilled in the art, it will be understood that I wish to include within the claims of the patent warranted hereon all such changes and modifications as reasonably come within my contribution to the art.

I claim as my invention:

1. In a method for manufacturing a planar photodiode wherein a plurality of layers of semiconductor material are epitaxially deposited on one another, and wherein a hetero junction arises between a layer provided with a pn junction and a layer adjacent thereto, wherein the improvement comprises the steps of: epitaxially depositing a first layer and then a second layer on a substrate body, a semiconductor material of the second layer being a material having a background doping value such that a pn junction with an avalanche effect is subsequently generatable in the second layer, a material of the first layer being selectively etchable relative to the material of the second layer, a material of the substrate body being selectively etchable relative to the material of the first layer, and a diffusion coefficient of a dopant for the second layer being at least not significantly higher for the material of the first layer than for the material of the second layer; epitaxially growing a third layer on the second layer, said third layer comprising a material having as high as possible an absorption of radiation for which the photodiode is being designed; epitaxially depositing a further semiconductor material for a carrier body on the third layer; selectively etching away the substrate body; by photolithography, selectively etching a corresponding mask opening in the first layer for subsequent generation of the pn junction in the second layer; introducing a dopant into the second layer through said mask opening so as to create the pn junction in the second layer; removing a residue of the first layer by means of selective etching so that thereafter the pn junction lies exclusively in the second layer; and applying respective contacts to where said dopant was introduced into the second layer and at the carrier body.

2. A method according to claim 1 wherein indium phosphide is employed for the substrate body, indium gallium arsenide phosphide with a relatively low arsenic content is employed for the first layer, indium phosphide is employed for the second layer, indium gallium arsenide phosphide with a relatively high arsenic content is employed for the third layer, and indium phosphide is employed for the carrier body, whereby an epitaxial deposition for the first, second, and third layers occurs from an indium melt and the epitaxial deposition of the carrier body occurs from a tin melt.

3. A method according to claim 1 including the steps of providing the carrier body as comprising indium phosphide, the third layer as comprising indium gallium arsenide phosphide and being situated on the carrier body, and the second layer as comprising indium phosphide and being situated on the third layer with the pn junction existing in said second layer.

4. A method according to claim 1 including the steps of providing the carrier body as comprising gallium antimonide, the third layer as comprising indium arsenide antimonide situated on the carrier body, and the second layer as comprising gallium antimonide situated on the third layer and with the pn junction present in said second layer.

5. A method according to claim 1 including the steps of providing the carrier body as comprising cadmium telluride, the third layer as comprising mercury cadmium telluride situated on the carrier body, and the second layer as comprising cadmium telluride situated on the third layer and with the pn junction present in said second layer.

6. A method for manufacturing a planar photodiode, comprising the steps of:

providing a substrate and then epitaxially depositing on the substrate a first epitaxially grown masking layer and a second layer on the first layer which will have a pn junction therein and is of a semiconductor material having a background doping value such that an avalanche effect will be present;

epitaxially growing a third layer on the second layer, said third layer comprising a material having a high absorption of radiation for which the photodiode is designed relative to the second layer;

epitaxially depositing a further semiconductor material as a carrier body on the third layer;

selectively etching away the substrate body from the first layer;

selectively etching a corresponding mask opening in the first layer and introducing a dopant into the second layer through said mask opening in order to form said pn junction in the second layer and also in residue portions of the first layer, a diffusion coefficient of said dopant for the second layer being not significantly higher for the material of the first layer than for the material of the second layer;

removing the residue of the first layer by means of selective etching such that the pn junction lies only in the second layer; and applying a contact to where the dopant was introduced into the second layer and also applying a contact at the carrier body.

* * * * *